United States Patent [19]

O'Keefe

[11] 4,227,256
[45] Oct. 7, 1980

[54] AM BROADCAST TUNER WITH AUTOMATIC GAIN CONTROL

[75] Inventor: Gerald T. O'Keefe, San Mateo, Calif.

[73] Assignee: Quadracast Systems, Inc., Palo Alto, Calif.

[21] Appl. No.: 867,607

[22] Filed: Jan. 6, 1978

[51] Int. Cl.² .......................................... H04B 1/16
[52] U.S. Cl. ................................... 455/251; 455/251; 330/124 R
[58] Field of Search ............... 325/400, 402, 404, 405, 325/408, 410, 411, 397, 302, 304, 301, 305, 303, 307, 409; 333/2, 17 L, 17 R; 330/124 R

[56] References Cited

U.S. PATENT DOCUMENTS

| 3,005,094 | 10/1961 | Taylor | 325/404 |
| 3,234,469 | 2/1966 | Gunn | 325/404 |
| 3,539,725 | 11/1970 | Hellwarth et al. | 325/404 |
| 3,566,276 | 2/1971 | Finkel | 325/400 |
| 3,728,633 | 4/1973 | Krebs | 325/405 |
| 4,037,163 | 7/1977 | Nicholas | 325/404 |

FOREIGN PATENT DOCUMENTS 4049219  8/1968  Japan ......................................... 325/400

Primary Examiner—Benedict V. Safourek
Assistant Examiner—Tommy P. Chin
Attorney, Agent, or Firm—Robert G. Slick

[57] ABSTRACT

An RF amplifier stage of an AM broadcast tuner is disclosed wherein, depending upon the power level of the received input signal, said input signal is amplified by a high gain radio frequency amplifier, or by a low gain radio frequency amplifier, or by a combination of both the high and low gain radio frequency amplifiers at intermediate levels. This system provides wide dynamic range and low distortion in that it prevents amplifier saturation and reduces intermodulation product signal levels.

3 Claims, 1 Drawing Figure

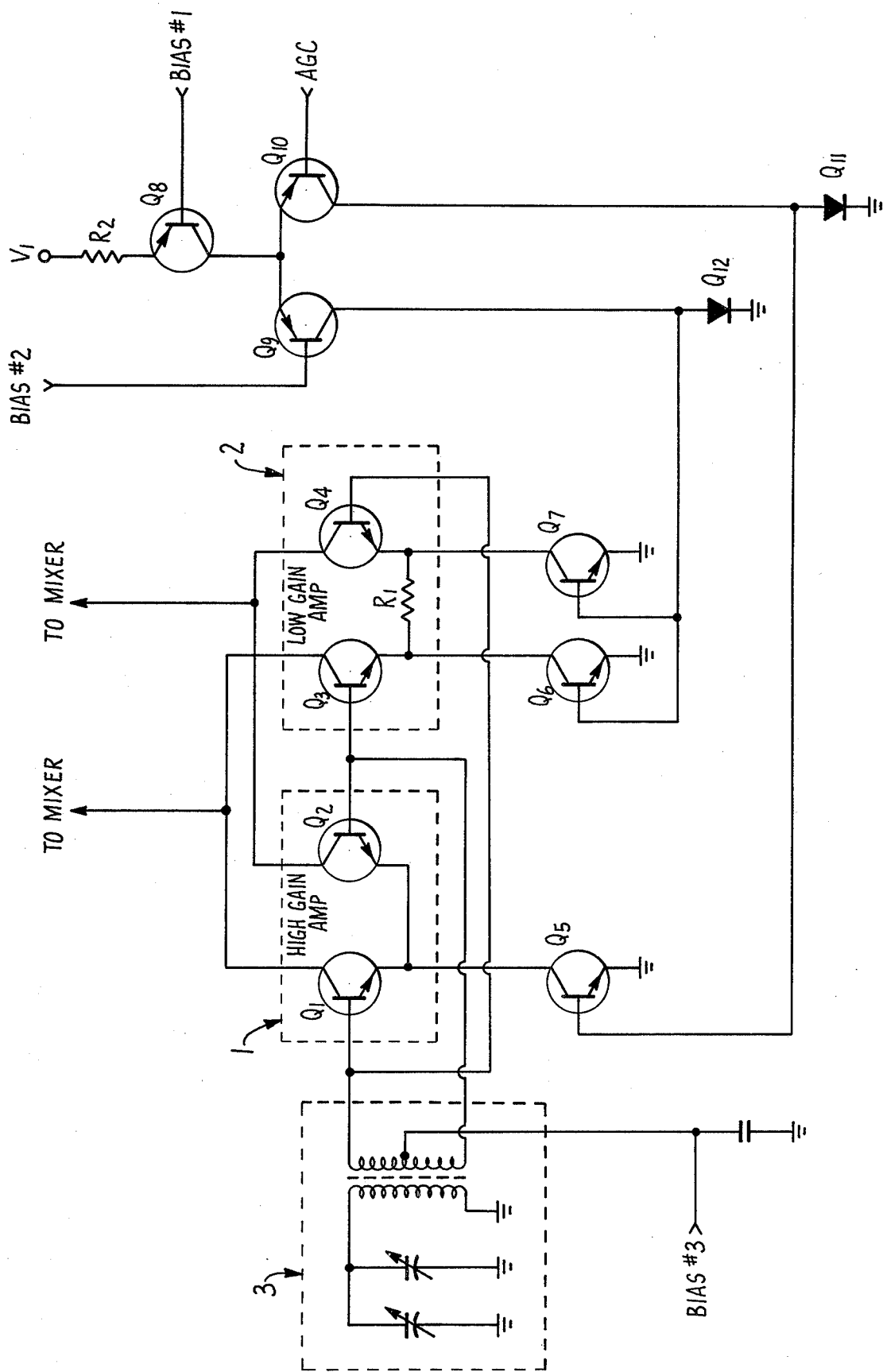

AM BROADCAST TUNER WITH AUTOMATIC GAIN CONTROL

SUMMARY OF THE INVENTION

In an AM broadcast receiver, the power level of the received input signal may vary over a broad range. Traditionally, this has created problems in the receiver's radio frequency amplifier stages. High gain amplifiers are needed to boost very weak signals, but when presented with large signal inputs, these amplifiers are driven into saturation. The result is signal distortion and generation of relatively high power intermodulation or cross-talk products.

This invention eliminates saturation problems when retaining sensitivity by the use of a separate high gain and low gain amplifiers combined with a graduated switching circuit to route low level input signals to the high gain amplifier and high level input signals to the low gain amplifier. Signals of intermediate strength will be amplified by both amplifiers. In operation, a broadcast signal received at the antenna terminal is applied in parallel to both the high gain and the low gain amplifiers. In the absence of any signal or in the presence of a received signal of relatively low power, the amplifier circuits are biased so that the high gain amplifier is "on" and the low gain amplifier is "off". At a later stage in the receiver, an automatic gain control circuit monitors the output power levels from the RF amplifiers. As the high gain amplifier output power increases, corresponding to an increase in input power, tending to drive the high gain amplifier into saturation, the automatic gain control circuit gradually reduces the gain of the high gain amplifier while simultaneously switching on the parallel low gain amplifier. As the input power increased beyond some pre-determined level, the AGC circuit completely switches off the high gain amplifier and the entire input signal is applied to the low gain amplifier.

The advantage of this switching circuit is that the receiver may be presented with an extremely wide range of input signal power levels without sacrificing sensitivity and without either RF amplifier being driven into saturation. This prevents signal distortion and reduces the power level of the intermodulation products generated within the amplifiers.

A further advantage of the present invention is that the circuit lends itself to integration, particularly as a portion of a LSI for a complete receiver.

BRIEF DESCRIPTION OF THE DRAWING

The sole FIGURE of the drawing is a simplified schematic diagram of a receiver input circuit showing the high and low gain amplifiers and the switching circuitry necessary to control their operation.

DESCRIPTION OF THE PREFERRED EMBODIMENTS

Referring to FIG. 1, transistors Q1 and Q2 comprise a high gain radio frequency amplifier, generally designated 1, and transistors Q3 and Q4 comprise a low gain radio frequency amplifier, generally designated 2. Current for high gain amplifier 1 is controlled by transistor Q5 and current for low gain amplifier 2 is controlled by transistors Q6 and Q7. Transistor Q5, and thus high gain amplifier 1, is switched on or off by transistor Q10. Similarly, transistors Q6 and Q7, and thus low gain amplifier 2, are switched on or off by transistor Q9. It will be understood that one amplifier is not suddenly switched off and the other on but rather that the transfer is made gradually so that at intermediate signal levels both amplifiers will be on. Fixed bias voltages are supplied to the bases of Q8 and Q9 while the AGC voltage, derived in the usual manner, is supplied to Q10. The AGC circuit is well known to those skilled in the art and is thus not described.

Assuming the presence of an arbitrarily low power RF signal at the antenna input terminal 3, the circuit is adjusted so that the high gain amplifier 1 is in the "on" mode and low gain amplifier 2 is "off". The amplified output of high gain amplifier 1 is fed to a conventional mixer circuit for conversion to an intermediate frequency, such as 455 kHz, then through conventional filtering circuits and finally is demodulated by a standard AM detector. (The mixer, filter and detector are not shown in FIG. 1 but all are well known circuits to those skilled in the art). At the detector, a DC voltage proportional to the signal power level is generated, this voltage being applied as the automatic gain control input to the base of transistor Q10. An increase in AGC voltage begins to turn off transistor Q10.

In actual operation, the circuit is adjusted in such a manner that so long as the RF input power level is within the range of linear amplification by high gain amplifier 1, the level of the AGC voltage generated at the detector is insufficient to turn off transistor Q10. As the input power increases, the AGC voltage increases and Q10 gradually begins to reduce the current flowing to ground through diode Q11. This in turn reduces the voltage on the base of Q5 which reduces the current supply available to high gain amplifier 1. Reduction in this current results in a reduction in gain of amplifier 1.

As the AGC voltage starts to turn Q10 off, the voltage on the emitter of Q9 begins to conduct current to ground through diode Q12. This raises the voltage on the bases of transistors Q6 and Q7, permitting low gain amplifier 2 to come "on". As the input signal power continues to increase, there is finally reached a point where high gain amplifier 1 is completely "off" and all signal amplification is performed by low gain amplifier 2. By proper selection of resistor R₁, connected across the emitter leads of transistors Q3 and Q4, very large input power levels may be applied to low gain amplifier 2 without driving the amplifier into saturation.

Under some high signal conditions, even the low gain amplifier may be overdriven. Delayed AGC voltage can be applied to bias #2 which will cut Q3 and Q4 off so that the low gain amplifier is cut off and becomes an attenuator.

Although a specific circuit has been shown, this is for purposes of illustration only and many variations can be made in the exact structure shown without departing from the spirit of this invention.

I claim:

1. A R.F. amplifier stage, said amplifier including an output line to a mixer and an input line from a source of AGC voltage, comprising in combination:
   a. an antenna circuit,
   b. a high-gain RF amplifier;
   c. a low-gain RF amplifier;
   d. means for introducing the output of the antenna circuit in parallel direct to both the high-gain and low-gain amplifiers;
   e. fixed bias means normally biasing said high-gain amplifier on and said low-gain amplifier off;

f. said source of AGC voltage generating a DC voltage proportional to the signal power level in said antenna circuit;

g. means for applying said DC voltage as an automatic gain control voltage to switching circuitry controlling said high-gain amplifier and said low-gain amplifier whereby said high-gain amplifier is gradually turned off and said low-gain amplifier is gradually turned on as said DC voltage increases.

2. The tuner of claim 1 wherein said high gain amplifier is switched off at a level below the saturation level of said amplifier.

3. The RF amplifier of claim 1 wherein an AGC voltage is applied to the low-gain RF amplifier to cut the amplifier off whereby said amplifier acts as an attenuator.

* * * * *